(12) United States Patent
Kawanishi et al.

(10) Patent No.: US 9,816,004 B2
(45) Date of Patent: Nov. 14, 2017

(54) LITHOGRAPHY PATTERN FORMING METHOD USING SELF-ORGANIZING BLOCK COPOLYMER

(71) Applicant: Toshiba Memory Corporation, Tokyo (JP)

(72) Inventors: Ayako Kawanishi, Yokohama Kanagawa (JP); Yusuke Kasahara, Yokohama Kanagawa (JP); Hiroki Yonemitsu, Chigasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/233,898

(22) Filed: Aug. 10, 2016

(65) Prior Publication Data

US 2017/0076952 A1    Mar. 16, 2017

(30) Foreign Application Priority Data

Sep. 11, 2015 (JP) ................................. 2015-179289

(51) Int. Cl.
*H01L 21/308* (2006.01)
*H01L 21/311* (2006.01)
(Continued)

(52) U.S. Cl.
CPC ......... *C09D 153/00* (2013.01); *G03F 7/0002* (2013.01); *H01L 21/0337* (2013.01); *H01L 21/31144* (2013.01)

(58) Field of Classification Search
CPC .......................... H01L 21/312–21/3128; H01L 21/027–21/0338; H01L 21/3081;
(Continued)

(56) References Cited

U.S. PATENT DOCUMENTS 8,808,557 B1    8/2014   Seino et al.
8,920,664 B2   12/2014   Seino et al.
(Continued)

FOREIGN PATENT DOCUMENTS

| JP | 2011129874 A | 6/2011 |
| JP | 2014-022550 A | 2/2014 |
| JP | 2014160734 A | 9/2014 |

*Primary Examiner* — Evan Pert
*Assistant Examiner* — Changhyun Yi
(74) *Attorney, Agent, or Firm* — Patterson & Sheridan, LLP

(57) ABSTRACT

A pattern forming method includes forming a guide mask layer including a first feature having a first opening width, a second feature having a second opening width, a third feature having a third opening width. The first width being less than the second width and greater than the third width. A self-organizing material having a phase-separation period is disposed on the guide mask layer to at least partially fill the first, second, and third features. The self-organizing material is process to the cause phase-separation into first and second polymer portions. The first width is greater than the phase-separation period and the third width is less. A masking pattern is formed on the first layer by removing the second polymer portions and leaving the first polymer portions. The masking pattern is then transferred to the first layer.

19 Claims, 14 Drawing Sheets

(51) Int. Cl.
*C09D 153/00* (2006.01)
*G03F 7/16* (2006.01)
*G03F 7/26* (2006.01)
*G03F 7/00* (2006.01)
*H01L 21/033* (2006.01)

(58) Field of Classification Search
CPC ........... H01L 21/31138; H01L 21/3086; H01L 21/31144; G03F 7/0035; G03F 7/0002
USPC .................................................. 438/52, 106
See application file for complete search history.

(56) References Cited

U.S. PATENT DOCUMENTS

| | | |
|---|---|---|
| 2011/0117744 A1 | 5/2011 | Ito |
| 2014/0021166 A1* | 1/2014 | Seino ...................... B29C 59/14 216/40 |
| 2016/0343575 A1* | 11/2016 | Maeda .............. H01L 21/31144 |

* cited by examiner

R1,R2

R1

R2

R2

R2

LITHOGRAPHY PATTERN FORMING METHOD USING SELF-ORGANIZING BLOCK COPOLYMER

CROSS-REFERENCE TO RELATED APPLICATION

This application is based upon and claims the benefit of priority from Japanese Patent Application No. 2015-179289, filed on Sep. 11, 2015, the entire contents of which are incorporated herein by reference.

FIELD

Embodiments described herein relate generally to a pattern forming method, in particular, a pattern forming method using a self-assembly or self-organizing material.

BACKGROUND

Recently, a lithography technology which uses a self-organizing material (also referred to as directed self-assembly (DSA) material) is developed. A DSA-type material can be used for forming dot patterns, hole patterns, pillar patterns, line patterns, or the like of various sizes, by adjusting molecular weights of components or ratios thereof. In order to form the patterns, a guide for controlling a position at which a polymer phase pattern that is formed by DSA is required. The guide for DSA patterning can include a physical guide (grapho-epitaxy), such as surface grooves or other topographical patterns, and a chemical guide (chemical-epitaxy) which determines a position at which a micro-phase separation pattern is formed based on patterned differences in surface energy of a surface.

For example, a resist film can be formed on a film to be processed, then a physical guide can be formed in the resist film by patterning the resist film according to optical lithography. For example, a hole pattern to be used as a physical guide can be formed in the resist film. A block copolymer (BCP) material can then be applied to the patterned resist film so as to fill the holes in the hole pattern. The block copolymer film thus applied can be heated. The block copolymer can become phase-separated by this processing. A hole pattern which is smaller than the hole pattern initially formed by the optical lithography process can be obtained by selectively removing a portion of the phase-separated polymer.

In the process to form the smaller hole pattern, a hole diameter is determined by the parameters of the block copolymer material, such as the amount of molecules. Hence, to form patterns having multiple hole diameters that are different from each other, different block copolymer materials would be required for each pattern size. In such cases, a separately performed lithography processes would generally be required for providing the different final pattern sizes corresponding to the different block copolymer materials, and thus, the number of processes and manufacturing costs may increase.

DETAILED DESCRIPTION

According to one embodiment, a pattern forming method comprises forming a guide mask layer on a first material layer, the guide mask layer including a first pattern feature having a first opening width, a second pattern feature having a second opening width, and a third pattern feature with a third opening width. The first opening width is less than the second opening width and greater than the third opening width. A self-organizing material having a phase-separation period is disposed on the guide mask layer to at least partially fill the first, second, and third pattern features in the guide mask layer. The self-organizing material disposed on the guide mask layer is processed to cause the self-organizing material to phase separate into first and second polymer portions. The first opening width is greater than or equal to the phase-separation period and the third opening width is less than the phase-separation period. A masking pattern is formed on the first material by removing the second polymer portions and leaving the first polymer portions. The masking pattern is transferred to the first material layer.

In another embodiment, a pattern forming method includes forming a mask member that includes a first pattern with a first opening width in which a self-organizing material is phase-separable in a first region on a workpiece film, a second pattern with a second opening width greater than the first opening width, and a third pattern with a width smaller than the first opening width in a second region on the workpiece film. Subsequently, the self-organizing material is supplied onto the mask member. Subsequently, the self-organizing materials in the first and second patterns are phase-separated into a first polymer portion and a second polymer portion, without phase-separation of the self-organizing material in the third pattern. A hole pattern is formed by removing the second polymer portion while leaving the first polymer portion. The workpiece film is processed with the mask member and the first polymer portion as a mask.

Hereinafter, embodiments will be described with reference to the drawings. The invention is not limited to the embodiments.

First Embodiment

FIG. 1 to FIG. 8B are cross-sectional views or plan views of a structure to explain a pattern forming method according to a first embodiment. FIG. 1, FIG. 2A, FIG. 2B, FIG. 4A to FIG. 5B, and FIG. 7A to FIG. 8B are cross-sectional views of the structure. FIG. 3A, FIG. 3B, FIG. 6A, and FIG. 6B are plan views of the structure. Meanwhile, FIG. 2A is a cross-sectional view of the structure taken along line IIA-IIA of FIG. 3A, and FIG. 2B is a cross-sectional view of the structure taken along line IIB-IIB of FIG. 3B. FIG. 5A is a cross-sectional view of the structure taken along line VA-VA of FIG. 6A, and FIG. 5B is a cross-sectional view of the structure taken along line VB-VB of FIG. 6B.

Figure 1:
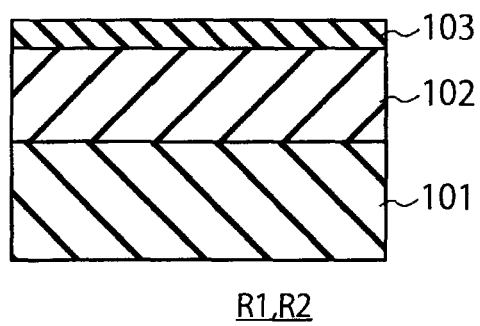
FIG. 1 is a cross-sectional view illustrating aspects of a pattern forming method according to a first embodiment.
Figure 2A:
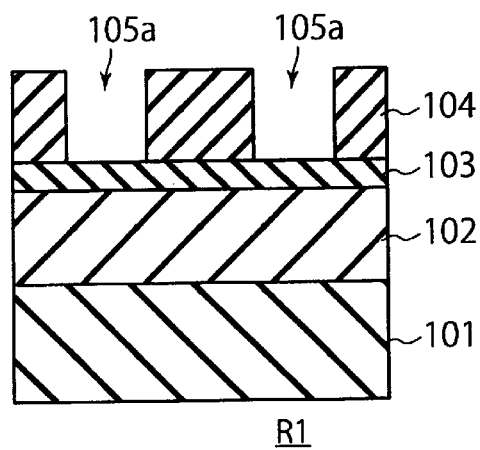
FIGS. 2A and 2B are cross-sectional views illustrating additional aspects of the pattern forming method according to the first embodiment.
Figure 2B:
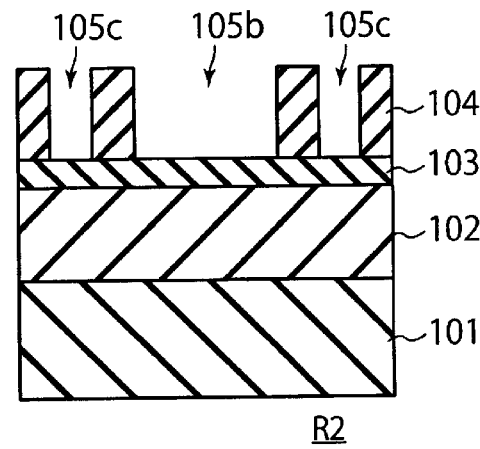

Firstly, as illustrated in FIG. 1, a hard mask 102 is formed on a material film 101, and an anti-reflective film 103 is formed on the hard mask 102. The material film 101 is, for example, an oxide film with a thickness of 300 nm and formed over a semiconductor substrate. The hard mask 102 is, for example, a carbon film with a thickness of 100 nm and formed through a chemical vapor deposition (CVD) method or coating. In addition, the anti-reflective film 103 is, for example, an oxide film with a thickness of 15 nm and formed through the CVD method or coating.

Secondly, as illustrated in FIGS. 2A and 2B, and FIGS. 3A and 3B, the anti-reflective film 103 is spin-coated with a resist film 104 with a thickness of 120 nm, and is exposed and developed by an ArF immersion excimer laser with the amount of exposure of 20 mJ/cm$^2$, whereby hole patterns 105a, 105b, and 105c are formed in the resist film 104 as a mask member. The first hole pattern (first pattern) 105a is formed in a first region R1 on an upper surface of the anti-reflective film 103 as a film to be processed. The second hole pattern (second pattern) 105b and the third hole pattern (third pattern) 105c are formed in a second region R2 on an upper surface of the anti-reflective film 103. The first region R1 and the second region R2 are different regions on the upper surface of the anti-reflective film 103. The first region R1 and the second region R2 may be adjacent to each other or may be separated from each other. In addition, the first region R1 and the second region R2 may have the same area or may have different areas from each other.

Meanwhile, the hard mask 102 and the anti-reflective film 103 are processed, using the resist film 104 and polymer layers (107a and 107b of FIGS. 7A and 7B) which are formed on the anti-reflective film 103, as masks, in post processes. Here, the resist film 104 and the polymer layers will be referred to as mask members, and the hard mask 102 and the anti-reflective film 103 will be referred to as films to be processed.

Figure 3A:
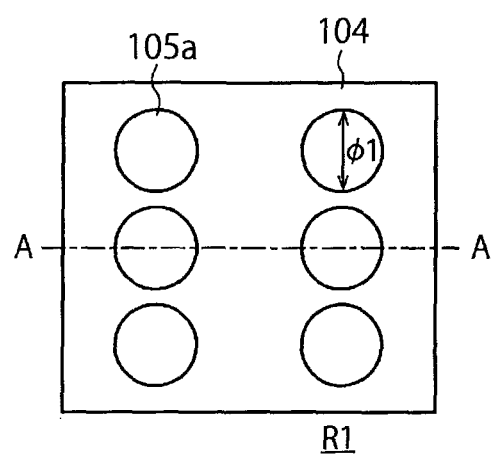
FIGS. 3A and 3B are plan views illustrating additional aspects of the pattern forming method according to the first embodiment.
Figure 3B:
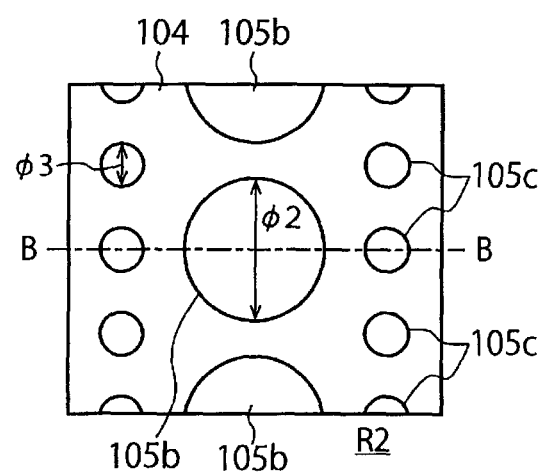

A layout shape (planar shape) of the hole patterns 105a to 105c may be any one of a substantially circular shape, a substantially oval shape, a substantially rectangular shape, and a groove. However, as illustrated in FIGS. 3A and 3B, when the planar shape is the circular shape, a diameter (first opening width) Φ1 of the first hole pattern 105a is smaller than a diameter (second opening width) Φ2 of the second hole pattern 105b, and is greater than a diameter (third opening width) Φ3 of the third hole pattern 105c. The diameter (first opening width) Φ1 of the first hole pattern 105a is, for example, approximately 70 nm. The diameter (second opening width) Φ2 of the second hole pattern 105b is greater than the first opening width Φ1 and the third opening width Φ3 and is, for example, approximately 100 nm. The diameter (third opening width) Φ3 of the third hole pattern 105c is smaller than the first opening width Φ1 and the second opening width Φ2 and is, for example, approximately 45 nm. The diameters of the hole patterns 105a to 105c will be described below in detail.

The resist film 104 having the hole patterns 105a to 105c functions as a physical guide layer when microphase separation of a block copolymer which is formed in a post process occurs. Microphase separation patterns which are formed in the hole patterns 105a and 105b are processed into a pattern which is transferred to the material film 101. Meanwhile, the third hole pattern 105c is a dummy pattern which is formed for adjusting a coverage ratio (or opening ratio) of the resist film 104. A ratio (Sb/Sa) of an area (layout area) Sb which is covered with the resist film 104 in a region on an upper surface of the anti-reflective film 103 to an area Sa of the region is referred to as a coverage ratio. Meanwhile, a ratio (Sc/Sa) of an area Sc of the hole patterns 105a to 105c which are formed in a region on the upper surface of the anti-reflective film 103 to the area Sa of the region is referred to as an opening ratio. Meanwhile, Sb is an area which is covered with the resist film 104 in the upper surface of the anti-reflective film 103, and Sc is an area in which the resist film 104 is removed in the upper surface of the anti-reflective film 103. Hence, the sum of Sb/Sa and Sc/Sa is approximately 1.

For example, as illustrated in FIG. 3A, the first hole pattern 105a is formed in the first region R1. The third hole pattern 105c as a dummy pattern is not formed in the first region R1. Meanwhile, as illustrated in FIG. 3B, the third hole pattern 105c is formed together with the second hole pattern 105b in the second region R2. By forming the third hole pattern 105c as a dummy pattern in the second region R2, the coverage ratio of the resist film 104 in the second region R2 can be adjusted to be less than the coverage ratio of the resist film 104 in the first region R1. In contrast to this, the opening ratio of the resist film 104 in the second region R2 is greater than the opening ratio of the resist film 104 in the first region R1. According to this difference of the opening ratio of the resist film 104, as will be described below, a thickness of a block copolymer 106 in the second region R2 becomes smaller than that of the first region R1. The first region R1 is not particularly limited, but, for example, is a memory cell region which needs to be processed into a fine hole pattern. The second region R2 is not particularly limited, but, for example, is a peripheral circuit region which can be processed into a relatively large hole pattern.

Figure 4A:
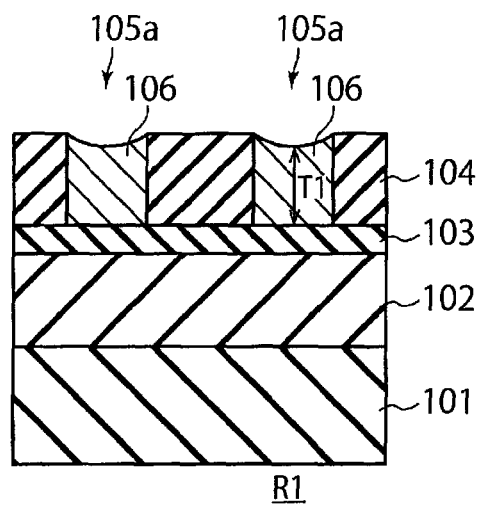
FIGS. 4A and 4B are cross-sectional views illustrating further aspects of the pattern forming method according to the first embodiment.
Figure 4B:
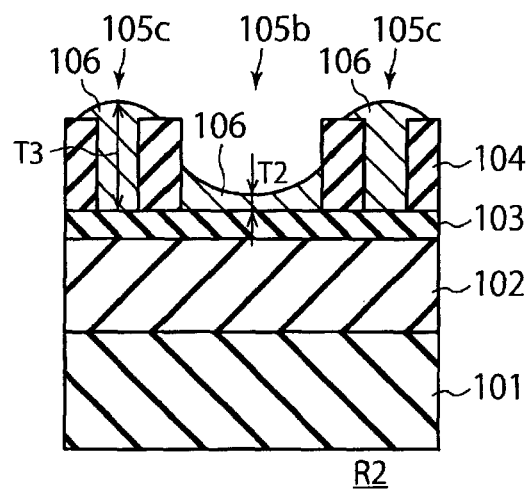

Subsequently, as illustrated in FIGS. 4A and 4B, the resist film 104 is coated with the block copolymer 106. The block copolymer 106 is a self-organizing material and includes a block copolymer (PS-b-PMMA) of polystyrene (PS) and polymethyl methacrylate (PMMA). For example, a ratio of a number average molecular amount (Mn) between a PS block and a PMMA block of PS-b-PMMA is approximately 24,000 to approximately 4,700. The resist film 104 is spin-coated at 2,000 rpm with a propylene glycol monomethyl ether acetate (PGMEA) solution which contains PS-b-PMMA of approximately 1.0 wt %. As a result, the block copolymer 106 is supplied to the inside of the hole patterns 105a to 105c.

As described above, a coverage ratio of the resist film 104 in the second region R2 is less than the coverage ratio of the resist film 104 in the first region R1. For this reason, when the resist film 104 is spin-coated with the PS-b-PMMA solution, a thickness T2 of the block copolymer 106 staying in the second hole pattern 105b becomes smaller than a thickness T1 of the block copolymer 106 staying in the first hole pattern 105a, as illustrated in FIGS. 4A and 4B. This difference of the thickness is caused by the diameter $\Phi 2$ of the second hole pattern 105b being greater than the diameter $\Phi 1$ of the first hole pattern 105a, and the opening ratio of the hole patterns 105b and 105c in the second region R2 being greater than the opening ratio of the hole pattern 105a in the first region R1. That is, when the resist film 104 is spin-coated with the block copolymer 106, the block copolymer 106 tends to flow out from the second hole pattern 105b with a relatively large opening width, but tends to stay in the first hole pattern 105a with a relatively small opening width. In addition, the block copolymer 106 little flows out from the third hole pattern 105c with a smaller opening width than that of the first hole pattern 105a because of capillary force. Furthermore, as the coverage ratio of the resist film 104 decreases (i.e., the opening ratio of the resist film 104 increases), the block copolymer 106 tends to stay over a wider range of the region. Hence, if the resist film 104 is spin-coated with the block copolymer 106, the thickness of the block copolymer 106 becomes smaller in the second region R2 having both the second and third hole patterns 105b and 105c (with large opening ratio), and becomes relatively great in the first region R1, which only has the first hole pattern 105a (with small opening ratio). As a result, as illustrated in FIGS. 4A and 4B, because of the difference in the opening widths $\Phi 1$ to $\Phi 3$ of the hole patterns 105a to 105c and the coverage ratios (opening ratios) of the resist film 104, the thickness of the block copolymer 106 becomes relatively small in the second hole pattern 105b and relatively great in the first hole pattern 105a. That is, if the thickness of the block copolymer 106 in the first hole pattern 105a is set as T1 and the thickness of the block copolymer 106 in the second hole pattern 105b is set as T2, T2<T1 is satisfied. In addition, the third hole pattern 105c is filled with the block copolymer 106, and the thickness of the block copolymer 106 is very great. That is, if the thickness of the block copolymer 106 in the third hole pattern 105c is set as T3, T2<T1≤T3 is satisfied. In this way, according to the present embodiment, the thickness of the block copolymer 106 is differentiated by varying the opening widths $\Phi 1$ to $\Phi 3$ of the hole patterns 105a to 105c and the coverage ratios (opening ratios) of the resist film 104.

Figure 5A:
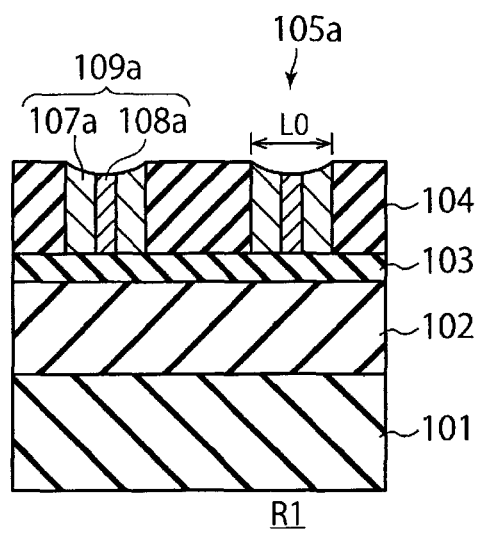
FIGS. 5A and 5B are cross-sectional views illustrating further aspects of the pattern forming method according to the first embodiment.
Figure 5B:
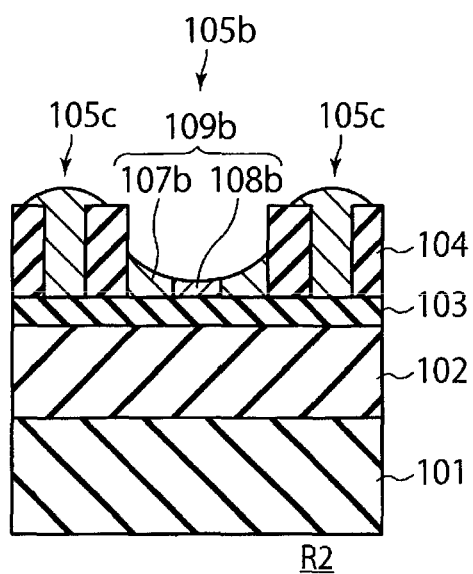

Subsequently, as illustrated in FIGS. 5A and 5B, the material film 101 or the like is heated for 90 seconds at approximately 110° C. on a hot plate, and furthermore, heated for three minutes at approximately 220° C. in a nitrogen atmosphere. Through this process, microphase separation of the block copolymer 106 occurs, and self-organizing phases 109a and 109b, which include first polymer portions 107a and 107b including first polymer block chains, and second polymer portions 108a and 108b including second polymer block chains, are formed. For example, the first polymer portions 107a and 107b, which predominately include PS segments having high hydrophobicity, are respectively formed (segregated) on side wall portions of the first and second hole patterns 105a and 105b. The second polymer portions 108a and 108b, which predominately include PMMA segments having high hydrophilicity, are respectively formed (segregated) in a central portion of the first and second hole patterns 105a and 105b. As a result, the second polymer portions 108a and 108b are formed in a vertical cylinder shape (pillar shape). The diameter of the second polymer portion 108a is, for example, approximately 25 nm, and the diameter of the second polymer portion 108b is, for example, approximately 30 nm. The microphase separation of the block copolymer 106 filled in the third hole pattern 105c does not occur.

Hereinafter, the opening widths $\Phi 1$ to $\Phi 3$ of the first to third hole patterns 105a to 105c will be described. As described above, if the diameter (first opening width) of the first hole pattern 105a is set as $\Phi 1$, the diameter (second opening width) of the second hole pattern 105b is set as $\Phi 2$, and the diameter (third opening width) of the third hole pattern 105c is set as $\Phi 3$, then a relationship of $\Phi 2 > \Phi 1 > \Phi 3$ is satisfied. Furthermore, the first and second opening widths $\Phi 1$ and $\Phi 2$ are greater than or equal to a phase separation period of the block copolymer 106, such that microphase separation of the block copolymer 106 will occur in the first and second hole patterns 105a and 105b. That is, the first and second opening widths $\Phi 1$ and $\Phi 2$ have widths wide enough for phase separation of the block copolymer 106 to occur for the particular material used as block copolymer 106. In addition, the third opening width $\Phi 3$ is smaller than the phase separation period of the block copolymer 106, such that microphase separation of the block copolymer 106 does not occur in the third hole pattern 105c. That is, the third opening width $\Phi 3$ is narrow enough to prevent phase separation of the block copolymer 106 inside the third opening (third hole pattern 105c).

For example, if the above-described PS-b-PMMA copolymer is used as the block copolymer 106, a phase separation period L0 of the block copolymer 106 can be approximately 50 nm. The phase separation period L0 is the repetitive intervals (pitch) of phase-separated regions of a material (or mixture of materials) in a relaxed state at equilibrium for conditions at which phase separation of the material (e.g., block copolymer 106) occurs. For example, if the diameter of the first hole pattern 105a is equal to the phase separation period L0, the phase separation of the block copolymer 106 occurs in in an equilibrium state in the first hole pattern 105a. Hence, in this case, the total widths (diameter of a cylinder shape in a cross section in a direction parallel to a surface of the structure) of the second polymer portion 108a of a cylinder shape and the first polymer portion 107a formed in the periphery of the second polymer portion becomes equal to the phase separation period L0.

Figure 6A:
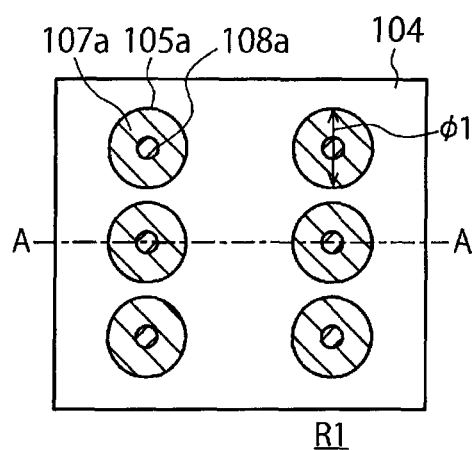
FIGS. 6A and 6B are plan views illustrating further aspects of the pattern forming method according to the first embodiment.
Figure 6B:
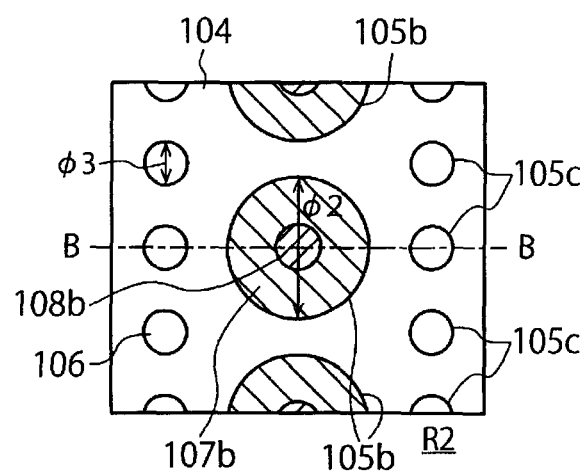

As illustrated in FIGS. 6A and 6B, by setting the first and second opening widths $\Phi 1$ and $\Phi 2$ to be greater than or equal to the phase separation period L0 of the block copolymer 106, the block copolymer 106 in the first and second hole patterns 105a and 105b can be phase-separated into the first polymer portions 107a and 107b and the second polymer portions 108a and 108b. Furthermore, as described below, if an opening width of a hole pattern is greater than the phase separation period L0, a period/pitch of the phase-separated block copolymer is likely to be pulled (elongated) to certain degree by the hole pattern, and thus the phase separation period becomes greater than the phase separation period L0 (which is for an unperturbed, relaxed material). As illustrated in FIG. 6B, by setting the third opening width $\Phi 3$ to be smaller than the phase separation period L0 of the block copolymer 106, the phase separation of the block copolymer 106 in the third hole pattern 105c does not occur. For example, if the phase separation period L0 is set as approximately 50 nm, the first opening width Φ1 is set as 70 nm, the second opening width Φ2 is set as 100 nm, and the third opening width Φ3 is set as 45 nm. Accordingly, it is possible to selectively phase-separate the block copolymer 106 in the first and second hole patterns 105a and 105b, without having the block copolymer 106 phase separate in the third hole pattern 105c.

Furthermore, to prevent random or chaotic phase separation of the block copolymer 106 in the second hole pattern 105b, it is preferable that the second opening width Φ2 is less than or equal to a value double the phase separation period L0 of the block copolymer 106. The above-described relationship can be represented by Expression 1.

$$2 \times L0 \geq \Phi2 > \Phi1 \geq L0 > \Phi3 \quad \text{(Expression 1)}$$

Figure 7A:
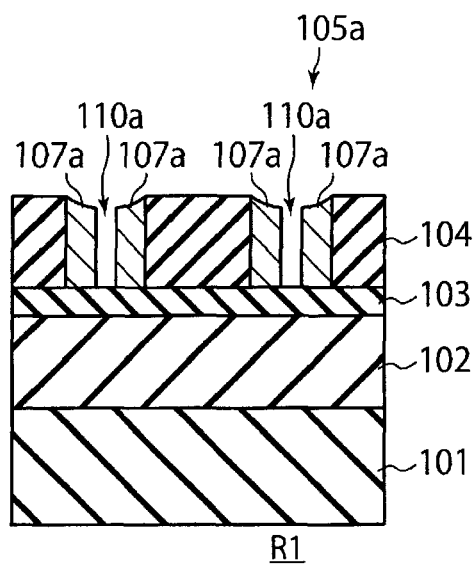
FIGS. 7A and 7B are cross-sectional views illustrating further aspects of the pattern forming method according to the first embodiment.
Figure 7B:
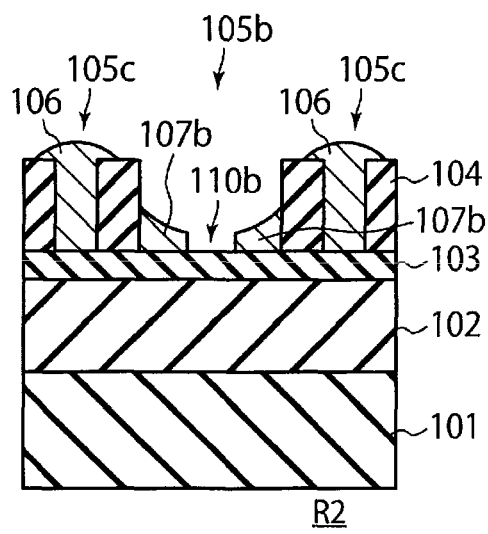

Next, the first polymer portions 107a and 107b are left and the second polymer portions 108a and 108b are selectively removed using an oxygen reactive ion etching (RIE) method. As a result, hole patterns 110a and 110b having a reduced dimension (compared to hole patterns 105a and 105b, respectively) are formed, as illustrated in FIGS. 7A and 7B. The hole patterns 110a and 110b respectively correspond in location to the original hole patterns 105a and 105b, but has a reduced dimension. The second opening width Φ2 of the second hole pattern 105b is greater than the phase separation period L0 and is also greater than the first opening width Φ1 of the first hole pattern 105a. Molecules in the polymer portion 107b in the second hole pattern 105b are generally pulled toward the side wall(s) of the second hole pattern 105b, therefore the hole pattern 110b dimension becomes somewhat larger than the dimension of the hole pattern 110a. For example, if the diameter of the hole pattern 110a is approximately 25 nm, then the diameter of the hole pattern 110b is approximately 30 nm.

As noted, phase separation of the block copolymer 106 in the third hole pattern 105c does not occur, as such the unseparated block copolymer 106 in the third hole pattern 105c is insubstantially etched by the oxygen RIE method. Hence, the third hole pattern 105c remains filled with the (unseparated) block copolymer 106, and no additional hole pattern is formed inside the third hole pattern 105c.

Figure 8A:
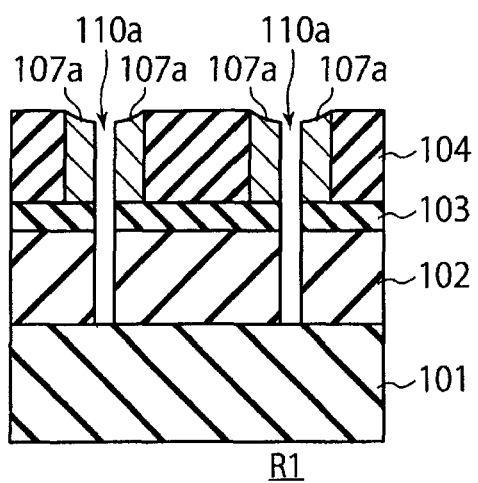
FIGS. 8A and 8B are cross-sectional views illustrating further aspects of the pattern forming method according to the first embodiment.
Figure 8B:
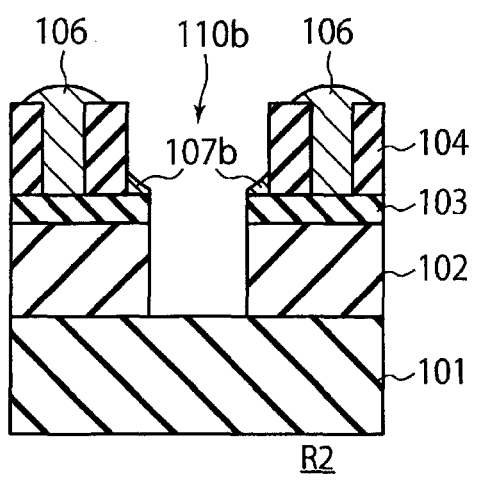

Subsequently, as illustrated in FIGS. 8A and 8B, the anti-reflective film 103 and the hard mask 102 are processed according to a RIE method using fluorine gas, and the remaining first polymer portions 107a and 107b, the block copolymer 106, and the resist film 104 as an etch mask. Through this process, the hole patterns 110a and 110b are transferred to the anti-reflective film 103 and the hard mask 102.

As described with reference to FIGS. 4A and 4B, since the thickness of the block copolymer 106 in the second hole pattern 105b is smaller than that of the block copolymer 106 in the first hole pattern 105a, the thickness of the first polymer portion 107b in the second hole pattern 105b is also smaller than that of the first polymer portion 107a in the first hole pattern 105a. Hence, when the anti-reflective film 103 and the hard mask 102 are etched, the opening corresponding to hole pattern 110b will increase in dimension because first polymer portion 107b progressively loses thickness during the etch process which, due to the varying thickness of the first polymer portion 107b from interior of hole pattern 105b to the surrounding sidewall formed by remaining portions of resist film 104, causes the mask opening formed by the first polymer portion 107b to increase in dimension during the etch processing.

Furthermore, an upper surface of the block copolymer 106, as depicted in FIGS. 4A and 4B, has a meniscus (curved) shape due interaction with the side wall of the resist film 104, in the first and second hole patterns 105a and 105b. Because the upper surface of the first polymer portion 107b has a meniscus shape, the periphery of the central portion of the second hole pattern 105b is relatively thin, and a portion away from the central portion is relatively thick. Hence, the first polymer portion 107b is gradually removed from the central portion of the second hole pattern 105b, when the anti-reflective film 103 and the hard mask 102 are etched. Thus, as the anti-reflective film 103 and the hard mask 102 are etched, the width of the opening in the hole pattern 110b becomes greater, and may approach the second opening width Φ2 of the second hole pattern 105b. As a result, the hole pattern 110b is greatly expanded in dimension when the anti-reflective film 103 and the hard mask 102 are processed, as illustrated in FIG. 7B and FIG. 8B. For example, the diameter of the hole pattern 110b that is transferred to the anti-reflective film 103 and the hard mask 102 is approximately 60 nm.

As described above, the first polymer portion 107b provides a somewhat enlarged large hole pattern 110b due to the pulling force of the sidewalls of the hole pattern 105b used as a physical guide layer. This effect also causes the thickness of the first polymer portion 107b to be relatively small as compared to first polymer portion 107a and the meniscus shape of the a surface of the first polymer portions. As a result, the diameter of the hole pattern 110b which is transferred to the anti-reflective film 103 and the hard mask 102 becomes greater than the diameter of the hole pattern 110a transferred to the anti-reflective film 103 and the hard mask 102. Here, the first polymer portion 107b may be substantially removed during transfer processing, and the diameter of the hole pattern 110b may become approximately equal to the second opening width Φ2.

In addition, since the surface of the first polymer portion 107b has a substantially concentric smooth meniscus shape corresponding to the shape of the second hole pattern 105b, a hole pattern with good critical dimension uniformity (CDU) can be transferred to the anti-reflective film 103 and the hard mask 102 in accordance with the shape of the second hole pattern 105b. As a result, it is possible to form the hole pattern 110b having a more uniform diameter.

Meanwhile, since the thickness of the block copolymer 106 in the first hole pattern 105a is greater than that of the block copolymer 106 in the second hole pattern 105b, the thickness of the first polymer portion 107a in the first hole pattern 105a is also sufficiently greater than that of the first polymer portion 107b in the second hole pattern 105b. Hence, even if the first polymer portion 107a is removed to some extent when the anti-reflective film 103 and the hard mask 102 are processed, the opening width of the hole pattern 110a does not necessarily change like the width of the hole pattern 110b. Hence, as illustrated in FIG. 7A and FIG. 8A, the hole pattern 110a is not greatly widened when transferred to the anti-reflective film 103 and the hard mask 102. Hence, the diameter of the hole pattern 110a is substantially maintained and may be, for example, approximately 25 nm.

Since the third hole pattern 105c is filled with the block copolymer 106, the third hole pattern 105c is not transferred to the anti-reflective film 103 and the hard mask 102.

Thereafter, the material film 101 can be further processed through the RIE method or the like, using the patterned hard mask 102 as a mask. Accordingly, the pattern of the hard mask 102 can be transferred to the material film 101. The hole pattern transferred to the material film 101 is used as, for example, a contact hole or the like.

As described above, according to the present embodiment, the third hole pattern 105c is used as a dummy pattern in the second region R2, and thus the coverage ratio of the resist film 104 in the second region R2 can be adjusted to be less than that of the resist film 104 in the first region R1. Furthermore, the second opening width $\Phi 2$ of the second hole pattern 105b is greater than the opening width $\Phi 1$ of the first hole pattern 105a. As a result, when the block copolymer 106 is spin-coated from the solution onto the resist film 104, the thickness T2 of the block copolymer 106 in the second hole pattern 105b becomes smaller than the thickness T1 of the block copolymer 106 in the first hole pattern 105a. As a result, the first polymer portion 107a also thinner than the first polymer portion 107b in the second hole pattern 105b. As a result, when the anti-reflective film 103 and the hard mask 102 are processed, the diameter of the hole pattern 110a in the first hole pattern 105a is maintained nearly as it is, and the diameter of the hole pattern 110b in the second hole pattern 105b can be expanded by some amount. As a result, it is possible to simultaneously transfer both the hole pattern 110a having a small opening width and the hole pattern 110b having a large opening width to the anti-reflective film 103 and the hard mask 102. That is, according to the present embodiment, it is possible to easily transfer different hole patterns having different opening widths to an underlying film.

In addition, the opening widths $\Phi 1$ and $\Phi 2$ of the first and second hole patterns 105a and 105b are greater than or equal to the phase separation period L0 of the block copolymer 106, and the third opening width $\Phi 3$ of the third hole pattern 105c is smaller than the phase separation period L0 of the block copolymer 106. Accordingly, the block copolymer 106 in the third hole pattern 105c stays as it is without phase separation, and the phase separation of the block copolymer 106 in the first and second hole patterns 105a and 105b occurs. Hence, the third hole pattern 105c can be used as a dummy pattern that is not transferred to the anti-reflective film 103 and the hard mask 102, and it is possible to transfer the hole patterns 110a and 110b in the first and second hole patterns 105a and 105b to the anti-reflective film 103 and the hard mask 102 without transferring the third hole patter 105c.

In the above-described example embodiment, there are two different opening widths of the transferred hole patterns (105a, 105b), but there may be three or more different opening widths. In this case, in a third region (not specifically illustrated) on the anti-reflective film 103, the opening widths of the hole patterns, the number of dummy patterns, or the like may change, and the thickness of the first polymer portion remaining in the third region hole patterns may be thereby adjusted.

Figure 9A:
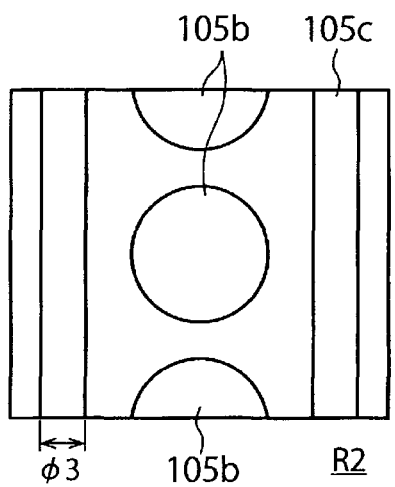
FIGS. 9A and 9B are plan views illustrating modification examples of a third hole pattern in a second region.
Figure 9B:
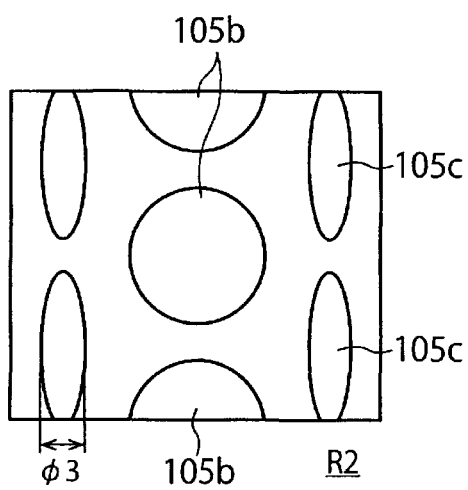

In addition, if the first to third hole patterns 105a to 105c have a substantially oval shape, a substantially rectangular shape, or a groove shape, the first to third opening widths $\Phi 1$ to $\Phi 3$ may be replaced with a minimum diameter (minimum guide width) of an opening. In this context, the hole pattern 105c would correspond to a groove shape which used to form a line/space pattern or the like. For example, FIGS. 9A and 9B are plan views of a structure according to modification examples of the third hole pattern (dummy pattern) 105c in the second region R2. In FIG. 9A, the third hole pattern 105c has a substantially rectangular shape or a groove shape. In FIG. 9B, the third hole pattern 105c has a substantially oval shape. In this way, even though the third hole pattern 105c is a substantially oval shape, a substantially rectangular shape, or a groove shape, as long as the minimum guide width $\Phi 3$ of the opening is smaller than the phase separation period L0 of the block copolymer 106, the phase separation of the block copolymer 106 in the third hole pattern 105c does not occur. In addition, the second hole pattern 105b can be a substantially oval shape, a substantially rectangular shape, or a groove shape, as long as the minimum guide width $\Phi 2$ of the opening width is greater than or equal to the phase separation period L0 of the block copolymer 106, then the phase separation of the block copolymer 106 in the second hole pattern 105b occurs. While not specifically illustrated, as long as the minimum guide width $\Phi 1$ of the opening width in the first hole pattern 105a is greater than or equal to the phase separation period L0 of the block copolymer 106, the phase separation of the block copolymer 106 in the first hole pattern 105a occurs.

Second Embodiment

Figure 10:
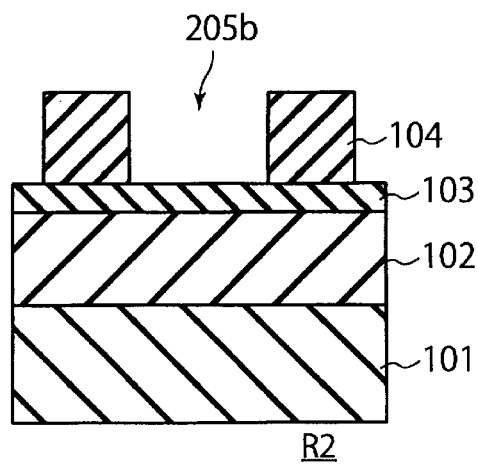
FIG. 10 is a cross-sectional view illustrating aspects of a pattern forming method according to a second embodiment.
Figure 11:
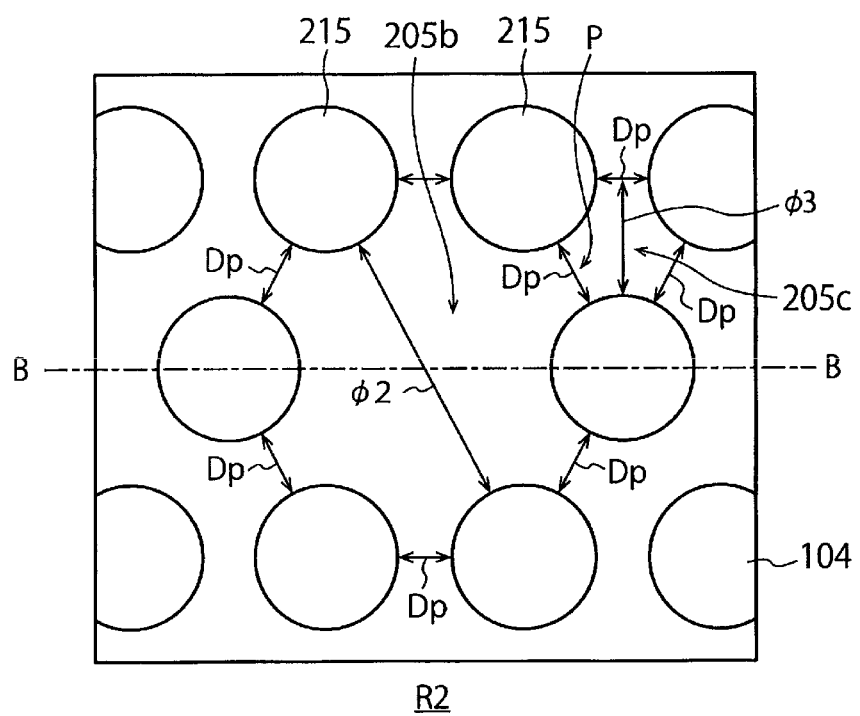
FIG. 11 is a plan view illustrating aspects of the pattern forming method according to the second embodiment.
Figure 12:
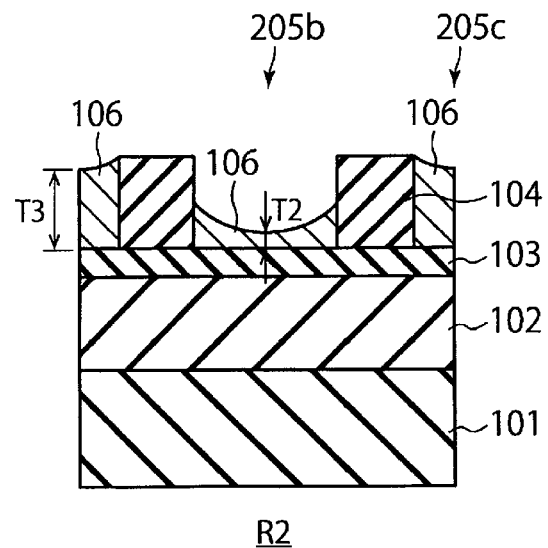
FIG. 12 is a cross-sectional view illustrating additional aspects of the pattern forming method according to the second embodiment.
Figure 13:
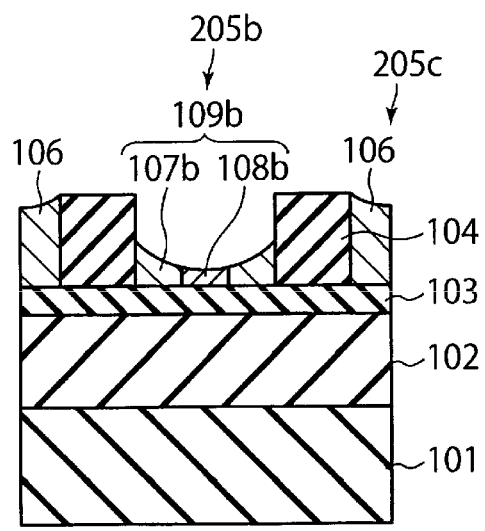
FIG. 13 is a cross-sectional view illustrating further aspects of the pattern forming method according to the second embodiment.
Figure 14:
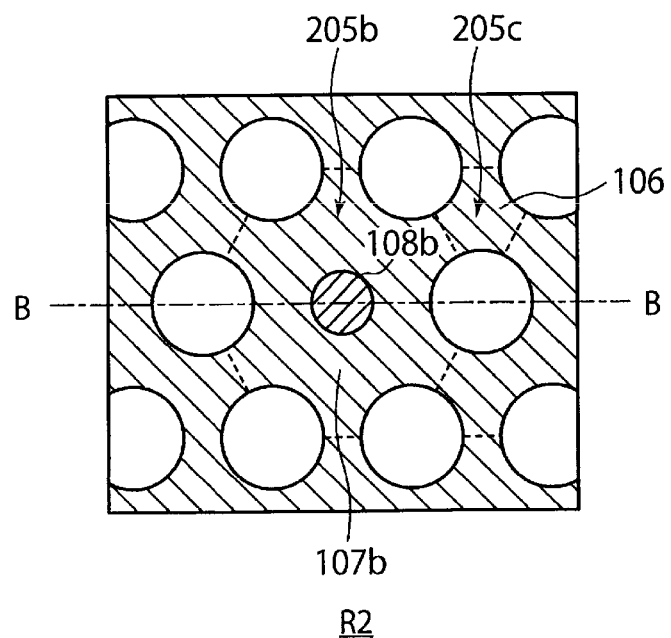
FIG. 14 is a plan view illustrating further aspects of the pattern forming method according to the second embodiment.

FIG. 10 to FIG. 15 are cross-sectional views and plan views of a structure to explain a pattern forming method according to a second embodiment. FIG. 11 and FIG. 14 are plan views of the structure in the second region R2. FIG. 10 is a cross-sectional view of the structure taken along line X-X in FIG. 11, and FIG. 13 is a cross-sectional view of the structure taken along line XIII-XIII in FIG. 14. Meanwhile, cross-sectional views and plan views of the structure in the first region R1 are substantially the same as those illustrated in FIG. 3A, FIG. 4A, FIG. 5A, FIG. 6A, FIG. 7A, and FIG. 8A, and thus, description thereof will be omitted.

First, after the processes described with reference to FIG. 1 are performed, the resist film 104 is formed on the anti-reflective film 103 and then patterned. Accordingly, a structure illustrated in FIG. 10 and FIG. 11 is obtained.

According to the second embodiment, the resist film 104 as a mask member includes a first space pattern 205b and a second space pattern 205c, in the second region R2, as illustrated in FIG. 11. The first and second space patterns 205b and 205c are surrounded by the multiple pillar patterns 215 which are formed of the resist film 104, and are regions in which the resist film 104 is not formed. The multiple pillar patterns 215 adjacent to each other are arranged so as to be separated by an interval Dp. The first space pattern 205b is a region which is surrounded by, for example, six pillar patterns 215, and is formed as a space pattern by omitting the pillar pattern 215 in a central portion thereof. The second space pattern 205c is a region which is surrounded by, for example, three pillar patterns 215. The space width of the first space pattern 205b is set as $\Phi 2$, and the space width of the second space pattern 205c is set as $\Phi 3$.

Hereinafter, the space widths $\Phi 2$ and $\Phi 3$ will be described. The space width $\Phi 2$ of the first space pattern 205b is greater than or equal to the phase separation period L0 of the block copolymer 106 and smaller than or equal to a value double the phase separation period L0. The space width $\Phi 3$ of the second space pattern 205c is smaller than the phase separation period L0 of the block copolymer 106. Furthermore, the space width $\Phi 2$ of the first space pattern 205b is greater than the first opening width $\Phi 1$ of the first hole pattern 105a. That is, the first opening width $\Phi 1$, and the space widths $\Phi 2$ and $\Phi 3$ satisfy the above-described Expression 1. As a result, the block copolymers 106 in the first hole pattern 105a and the first space pattern 205b can be phase-separated into the first polymer portions 107a and 107b and the second polymer portions 108a and 108b. The block copolymer 106 in the second space pattern 205c is not phase-separated. That is, the second space pattern 205c functions here as a dummy pattern.

For example, if PS-b-PMMA is used as block copolymer 106, the phase separation period L0 can be approximately 50 nm. In this case, the first opening width Φ1 is set as approximately 70 nm, the first space width Φ2 is set as approximately 100 nm, and the second space width Φ3 is set as approximately 45 nm. Accordingly, the block copolymer 106 in the second space pattern 205c is not phase-separated, and the block copolymer 106 in the first hole pattern 105a and the first space pattern 205b can be selectively phase-separated.

To prevent the block copolymer 106 from being randomly or chaotically phase-separated in the first space pattern 205b, it is preferable that the first space width Φ2 is smaller than or equal to a value double the phase separation period L0 of the block copolymer 106. As described above, also in the second embodiment, it is preferable that the first opening width Φ1, and the space widths Φ2 and Φ3 satisfy Expression 1.

In addition, in the second region R2, the resist film 104 remains in the pillar patterns 215, but the resist film 104 is removed from the space patterns 205b and 205c, which are regions other than the pillar patterns 215. As a result, the coverage ratio of the resist film 104 in the second region R2 becomes less than the coverage ratio of the resist film 104 in the first region R1. Furthermore, the space width Φ2 of the first space pattern 205b becomes greater than the first opening width Φ1 of the first hole pattern 105a. As a result, when the block copolymer 106 is spin-coated from solution onto the resist film 104, the thickness T2 of the block copolymer 106 in the first space pattern 205b is smaller than the thickness T1 (refer to FIG. 4A) of the block copolymer 106 in the first hole pattern 105a. In addition, since the space width Φ3 of the second space pattern 205c is smaller than the first opening width Φ1 the space width Φ2, the thickness T3 of the block copolymer 106 in the second space pattern 205c is greater than the thicknesses T1 and T2. In the second embodiment, the space patterns 205b and 205c are not completely separated by the resist film 104, and there is a linking or link portion P (FIG. 11) between the space patterns 205b and 205c in which the resist film 104 is not provided. The block copolymer 106 can move between the space patterns 205b and 205c through the link portion P. Hence, the block copolymer 106 moves from the first space pattern 205b to the second space pattern 205c due to a difference in capillary forces caused by difference between areas of the space patterns 205b and 205c. Hence, the thickness T3 of the block copolymer 106 in the second space pattern 205c becomes greater than the thicknesses T1 and T2.

In this way, in the second embodiment, the thickness of the block copolymer 106 can be controlled by using the opening width Φ1 of the first hole pattern 105a, the space widths Φ2 and Φ3 of the first and second space patterns 205b and 205c, and the coverage ratio (opening width) of the resist film 104. The upper surface of the block copolymer 106 will generally have a meniscus shape, as illustrated in FIG. 4A and FIG. 12.

Subsequently, as described with reference to FIGS. 5A and 5B, the material film 101 or the like will be heated on a hot plate. As a result, microphase separation of the block copolymer 106 occurs in the first space pattern 205b, and the self-organizing phase 109b which includes the first polymer portion 107b and the second polymer portion 108b is formed, as illustrated in FIG. 13 and FIG. 14. The block copolymer 106 is phase-separated in the first hole pattern 105a in the first region R1, as illustrated in FIG. 5A and FIG. 6A. Meanwhile, microphase separation of the block copolymer 106 does not occur in the second space pattern 205c.

Figure 15:
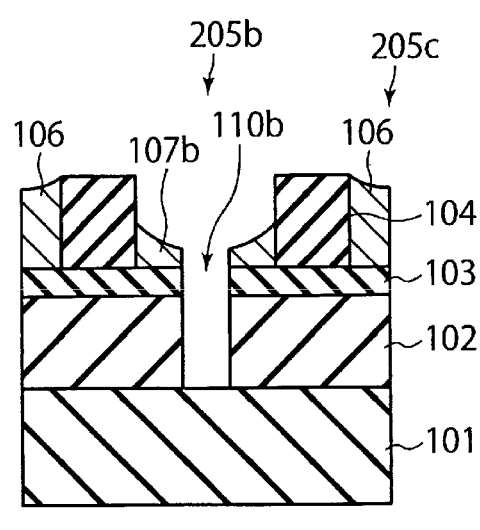
FIG. 15 is a cross-sectional view illustrating further aspects of the pattern forming method according to the second embodiment.

Subsequently, as described with reference to FIGS. 7A and 7B, the second polymer portions 108a and 108b are selectively removed through an oxygen RIE method, and the first polymer portions 107a and 107b remain. Furthermore, as described with reference to FIGS. 8A and 8B, the anti-reflective film 103 and the hard mask 102 are processed through an RIE method, using fluorine gas, and the remaining first polymer portions 107a and 107b and the resist film 104 as a mask. As a result, a structure depicted in FIG. 15 is obtained.

Here, since the thickness T2 of the block copolymer 106 in the first space pattern 205b is smaller than the thickness T1 of the block copolymer 106 in the first hole pattern 105a, the thickness of the first polymer portion 107b in the first space pattern 205b is also smaller than the thickness of the first polymer portion 107a in the first hole pattern 105a. Hence, the first polymer portion 107b is at least partially removed and its thickness becomes smaller and the opening corresponding to pattern 110b becomes wider when the anti-reflective film 103 and the hard mask 102 are etched. The first polymer portion 107b has a meniscus shape, and thus, the periphery of the central portion of the first space pattern 205b is relatively thin, and a portion away from the central portion is thick. Hence, the first polymer portion 107b is gradually removed from the central portion of the first space pattern 205b during etch processing of the anti-reflective film 103 and the hard mask 102. That is, as the anti-reflective film 103 and the hard mask 102 are processed, the opening width of the hole pattern 110b becomes greater. As a result, the hole pattern 110b is appreciably expanded when the anti-reflective film 103 and the hard mask 102 are processed, as illustrated in FIG. 15.

In addition, the surface of the first polymer portion 107b has a smooth meniscus shape along the shape of the first space pattern 205b, and thus, a pattern with good CDU can be transferred to the anti-reflective film 103 and the hard mask 102 in accordance with the shape of the first space pattern 205b. That is, it is possible to prevent the diameter of the hole pattern 110b from varying substantially.

As described with reference to FIG. 7A and FIG. 8A, the hole pattern 110a in the first hole pattern 105a is not greatly widened when transferred to the anti-reflective film 103 and the hard mask 102.

In addition, since the second space pattern 205c is filled with the block copolymer 106, the third hole pattern 105c is not transferred to the anti-reflective film 103 and the hard mask 102.

Thereafter, the material film 101 can be further processed through the RIE method or the like, using the processed hard mask 102 as a pattern mask. Through this process, the pattern of the hard mask 102 is transferred to the material film 101.

As described above, according to the second embodiment, the pillar patterns 215 function as a physical guide layer, the block copolymer 106 is not phase-separated in the second space pattern 205c, and is selectively phase-separated in the first space pattern 205b. Accordingly, even if the space patterns 205b and 205c which are surrounded by the pillar patterns 215 are used, a hole pattern with a small opening width and a hole pattern with a great opening width can be simultaneously transferred to a film. Furthermore, according to the second embodiment, it is also possible to obtain effects different from the effects of the first embodiment.

In the second embodiment, the planar shape (layout shape) of the pillar pattern 215 is a substantially circular shape, but may be a substantially oval shape or a substantially rectangular shape. In addition, the number of the pillar patterns 215 which surround the space patterns 205b and 205c is not particularly limited.

Figure 16A:
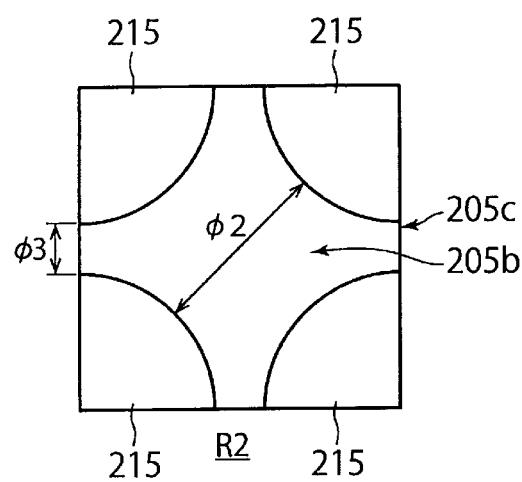
FIGS. 16A and 16B are plan views illustrating modification examples of a first space pattern.
Figure 16B:
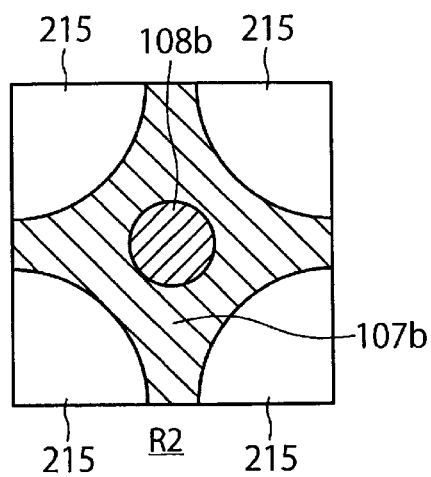

For example, FIGS. 16A and 16B are plan views of a structure according to modification examples of the first space pattern 205b. As illustrated in FIG. 16A, the first space pattern 205b may be a cross-shaped region which is surrounded by four pillar patterns 215. In this case, as illustrated in FIG. 16B, the block copolymer 106 can be phase-separated in the central portion of the first space pattern 205b. Meanwhile, the second space pattern 205c is a narrow region between the pillar patterns 215 adjacent to each other.

Figure 17A:
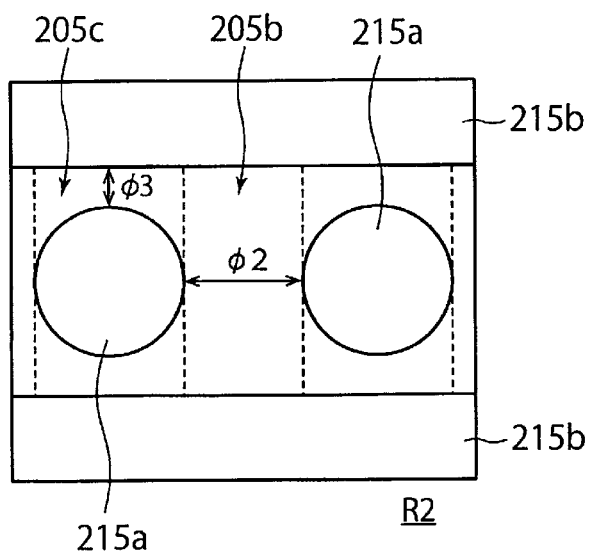
FIGS. 17A and 17B are plan views illustrating further modification examples of the first space pattern.
Figure 17B:
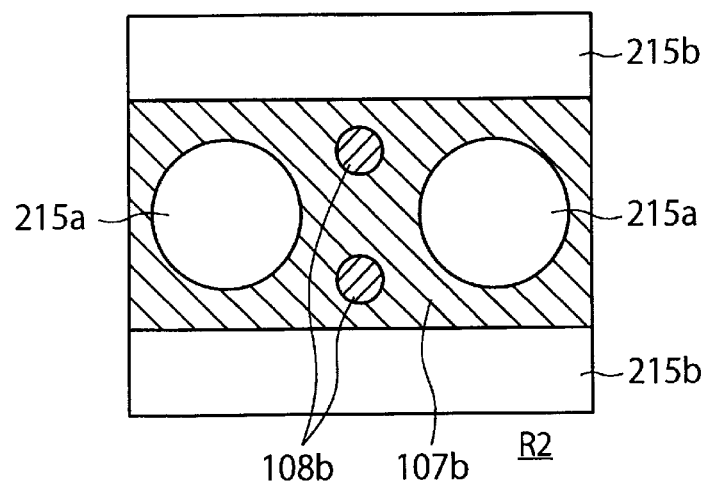

Furthermore, the multiple pillar patterns 215 of a planar shape may be combined. For example, FIGS. 17A and 17B are plan views of a structure according to other modification examples of the first space pattern 205b. As illustrated in FIG. 17A, the first space pattern 205b may be a region which is surrounded by a pillar pattern 215a of a substantially circular shape and a pillar pattern 215b of a substantially rectangular shape. In this case, as illustrated in FIG. 17B, the block copolymer 106 can be phase-separated so as to be symmetrical with respect to the center between the pillar patterns 215a and the center between the pillar patterns 215b, in a wide region which is positioned between the pillar patterns 215a and between the pillar patterns 215b. In this way, the first and second space patterns 205b and 205c can be formed in various shapes in accordance with the shapes and combinations of the pillar patterns 215.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
   forming a guide mask layer on a first material layer, the guide mask layer including a first pattern feature having a first opening width, a second pattern feature having a second opening width, and a third pattern feature with a third opening width, the first opening width being less than the second opening width and greater than the third opening width;
   disposing a self-organizing material having a phase-separation period on the guide mask layer to at least partially fill the first, second, and third pattern features in the guide mask layer;
   processing the self-organizing material disposed on the guide mask layer to cause the self-organizing material to phase separate into first and second polymer portions, the first opening width being greater than or equal to the phase-separation period and the third opening width being less than the phase-separation period;
   forming a masking pattern on the first material layer by removing the second polymer portions and leaving the first polymer portions; and
   transferring the masking pattern to the first material layer, wherein
   a thickness of the self-organizing material formed in the second pattern feature is less than a thickness of the guide mask layer on the first material layer, and
   a thickness of the self-organizing material formed in the third pattern feature is greater than the thickness of the guide mask layer.

2. The pattern forming method according to claim 1, wherein a thickness of the self-organizing material formed in the first pattern feature is greater than the thickness of the self-organizing material formed in the second pattern feature.

3. The pattern forming method according to claim 1, wherein the second opening width is equal to or less than twice the phase-separation period of the self-organizing material.

4. The pattern forming method according to claim 1, wherein
   the first pattern feature is formed in a first region of the guide mask layer,
   the second and third pattern features are formed in a second region of the guide mask layer, and
   an opening ratio of the guide mask layer in the first region is less than an opening ratio of the guide mask layer in the second region.

5. The pattern forming method according to claim 1, wherein
   the first and second pattern features are each a circular hole, and
   a diameter of the second pattern feature is the second opening width and a diameter of the first pattern feature is the first opening width.

6. The pattern forming method according to claim 5, wherein
   the third pattern feature is a circular hole, and
   a diameter of the third pattern feature is the third opening width.

7. The pattern forming method according to claim 1, wherein a thickness of the self-organizing material formed in the first pattern feature is less than the thickness of the self-organizing material formed in the third pattern feature.

8. The pattern forming method according to claim 1, wherein
   the self-organizing material formed in the first and second pattern features is phase separated into the first and second polymer portions, and
   the self-organizing material formed in the third pattern feature is not phase separated into the first and second polymer portions.

9. A pattern forming method, comprising:
   forming a guide mask layer on a first material layer, the guide mask layer including a first pattern with a first spacing width, a second pattern with a second spacing width, and a third pattern with a third spacing width;
   disposing a self-organizing material on the first material layer and the guide mask layer;
   processing the self-organizing material disposed on the first material layer and the guide mask layer to cause phase-separation of the self-organizing material into first phase portions and second phase portions, the first spacing width being set to greater than or equal to a phase-separation period of the self-organizing material, the second spacing width being greater than the first spacing width, and the third spacing width being less than the phase-separation period;
   exposing the self-organizing material to an oxygen plasma etch to remove the second phase portions while leaving the first phase portions and portions of the self-organizing material that did not phase separate; and patterning the first material layer using the guide mask layer, the first polymer portions, and the portions of the self-organizing material that did not phase separate as a mask, wherein the second pattern includes a plurality of pillars and the second spacing width is a maximum distance between pillars in the second pattern, and a distance between nearest neighbor pillars in the plurality of pillars is the third spacing width.

10. The pattern forming method according to claim 9, wherein the second spacing width is equal to or less than twice of the phase-separation period of the self-organizing material.

11. The pattern forming method according to claim 9, wherein the first pattern is formed in a first region of the guide mask layer, and the second and third patterns are formed in a second region of the guide mask layer, and an opening ratio of the guide mask layer in the first region is less than an opening ratio of the guide mask layer in the second region.

12. A pattern forming method, comprising:

forming a guide mask layer on a first material layer, the guide mask layer including a first circular hole having a first diameter, a second circular hole having a second diameter, and a third circular hole having a third diameter, the first diameter being less than the second diameter and greater than the third diameter;

disposing a self-organizing material having a phase-separation period on the guide mask layer to at least partially fill the first, second, and third circular holes in the guide mask layer;

processing the self-organizing material disposed on the guide mask layer to cause the self-organizing material to phase separate into first and second polymer portions, the first diameter being greater than or equal to the phase-separation period and the third diameter being less than the phase-separation period;

forming a masking pattern on the first material layer by removing the second polymer portions and leaving the first polymer portions; and transferring the masking pattern to the first material layer.

13. The pattern forming method according to claim 12, wherein a thickness of the self-organizing material formed in the first circular hole is greater than the thickness of the self-organizing material formed in the second circular hole.

14. The pattern forming method according to claim 12, wherein a thickness of the self-organizing material formed in the first circular hole is less than the thickness of the self-organizing material formed in the third circular hole.

15. The pattern forming method according to claim 12, wherein a thickness of the self-organizing material formed in the second circular hole is less than a thickness of the guide mask layer on the first material layer.

16. The pattern forming method according to claim 12, wherein a thickness of the self-organizing material formed in the third circular hole is greater than the thickness of the guide mask layer on the first material layer.

17. The pattern forming method according to claim 12, wherein the second diameter is equal to or less than twice the phase-separation period of the self-organizing material.

18. The pattern forming method according to claim 12, wherein the first circular hole is formed in a first region of the guide mask layer, the second and third circular holes are formed in a second region of the guide mask layer, and an opening ratio of the guide mask layer in the first region is less than an opening ratio of the guide mask layer in the second region.

19. The pattern forming method according to claim 12, wherein the self-organizing material formed in the first and second circular holes is phase separated into the first and second polymer portions, and the self-organizing material formed in the third circular hole is not phase separated into the first and second polymer portions.

* * * * *